(12) United States Patent
Schaarschmidt

(10) Patent No.: US 10,762,719 B2
(45) Date of Patent: Sep. 1, 2020

(54) METHOD AND SYSTEM FOR GENERATING A VISUAL INTERACTIVE PRODUCT CONFIGURATION

(71) Applicant: SAE SCHAARSCHMIDT ANALYTIC ENGINEERING GMBH, Weng (DE)

(72) Inventor: Erich Schaarschmidt, Mengkofen (DE)

( * ) Notice: Subject to any disclaimer, the term of this patent is extended or adjusted under 35 U.S.C. 154(b) by 6 days.

(21) Appl. No.: 15/550,042

(22) PCT Filed: Feb. 11, 2015

(86) PCT No.: PCT/EP2015/052816
§ 371 (c)(1),
(2) Date: Aug. 10, 2017

(87) PCT Pub. No.: WO2016/128034
PCT Pub. Date: Aug. 18, 2016

(65) Prior Publication Data
US 2018/0033212 A1 Feb. 1, 2018

(51) Int. Cl.
*G06T 15/00* (2011.01)
*G06T 19/20* (2011.01)
(Continued)

(52) U.S. Cl.
CPC .............. *G06T 19/20* (2013.01); *G06F 30/00* (2020.01); *G06Q 30/0643* (2013.01);
(Continued)

(58) Field of Classification Search
CPC .................................................... G06T 19/20
See application file for complete search history.

(56) References Cited

U.S. PATENT DOCUMENTS 7,035,815 B1 4/2006 Henson
2002/0156698 A1 10/2002 Machau et al.
(Continued)

FOREIGN PATENT DOCUMENTS

DE 19940209 A1 3/2000
EP 1087342 A2 3/2001
(Continued)

*Primary Examiner* — Charles Tseng
(74) *Attorney, Agent, or Firm* — Legends Law Group, PLLC; Stephen H. Bean, Esq.

(57) ABSTRACT

A method for generating an active visual product configuration based on interactive digital 2D or 3D objects displayed on an operating device. Processing options and degrees of freedom and/or object characteristics are defined in an object control unit of a data processing system. A variant model is created in the data processing system and corresponding parameters are assigned to the object and to the processing options. A visualization unit assigned to the operating device represents the complex variant model optically in a 3D-scenario for active product configuration. The active product configuration is carried out via a display device and/or a touch screen integrated in the operating device. All processing options and degrees of freedom of the object can be animated. During the production configuration, a communication control unit effects data communication between the visualization unit and the object control unit and the configuration instance of the variant model.

7 Claims, 7 Drawing Sheets

Activating the object property - object can be rotated interactively

(51) Int. Cl.
*G06Q 30/06* (2012.01)
*G06F 30/00* (2020.01)
G06F 3/0481 (2013.01)
G06F 3/0484 (2013.01)
G06F 3/0488 (2013.01)
G06T 13/20 (2011.01)

(52) U.S. Cl.
CPC ........ *G06F 3/0488* (2013.01); *G06F 3/04815* (2013.01); *G06F 3/04817* (2013.01); *G06F 3/04845* (2013.01); *G06T 13/20* (2013.01); *G06T 2200/24* (2013.01); *G06T 2219/2012* (2013.01); *G06T 2219/2016* (2013.01)

(56) References Cited

U.S. PATENT DOCUMENTS

| | | | |
|---|---|---|---|
| 2004/0046769 A1* | 3/2004 | Arvin | G06T 11/60 345/619 |
| 2004/0157641 A1* | 8/2004 | Chithambaram | G06Q 10/025 455/556.2 |
| 2006/0038812 A1* | 2/2006 | Warn | G06T 19/20 345/419 |
| 2007/0156540 A1 | 7/2007 | Koren et al. | |
| 2011/0137758 A1 | 6/2011 | Bienias | |
| 2014/0100825 A1* | 4/2014 | Summit | G06F 17/50 703/1 |
| 2015/0262402 A1* | 9/2015 | Heinz, II | H04N 21/44222 345/420 |

FOREIGN PATENT DOCUMENTS

| | | |
|---|---|---|
| EP | 1251444 B1 | 10/2005 |
| WO | 9852144 A1 | 11/1998 |

* cited by examiner

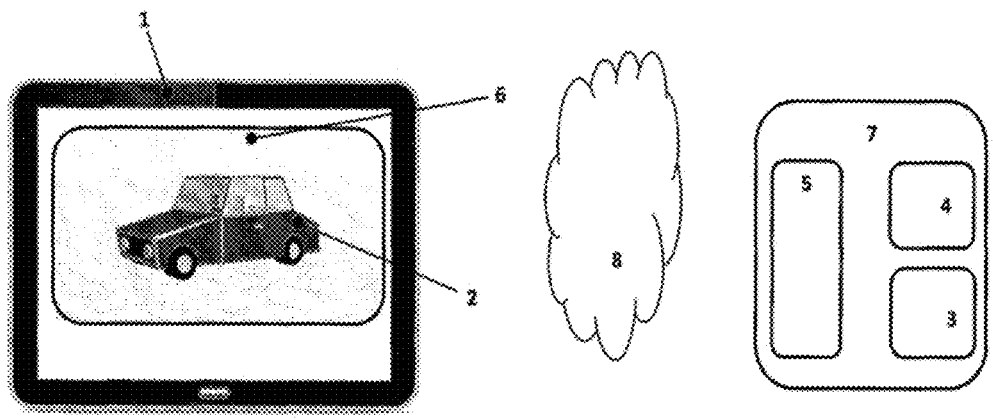
Fig. 1 Schematic diagram
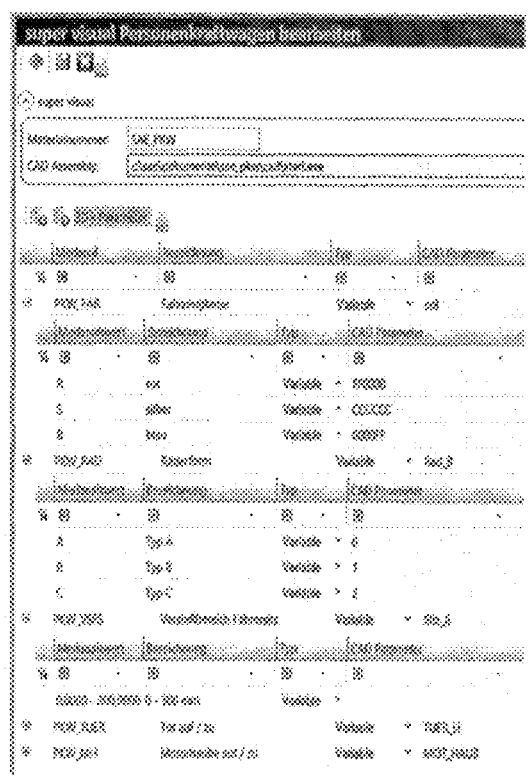
Fig. 1.1 Control unit 4:
Assignment of the attributes
of the variant model 3 to the
3D objects 2
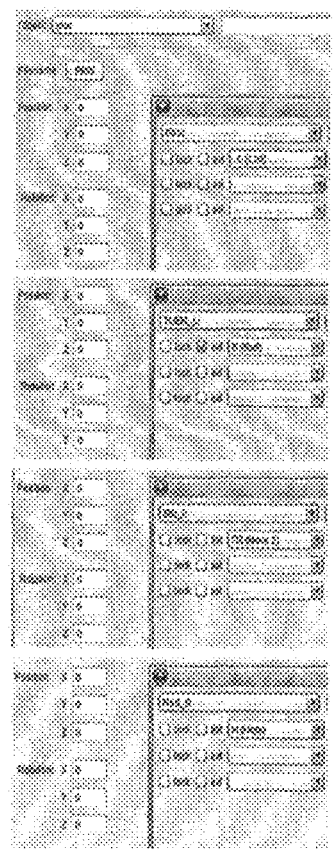
Fig 1.2 Control unit 4:
assignment/maintenance of
object properties of the
objects 2

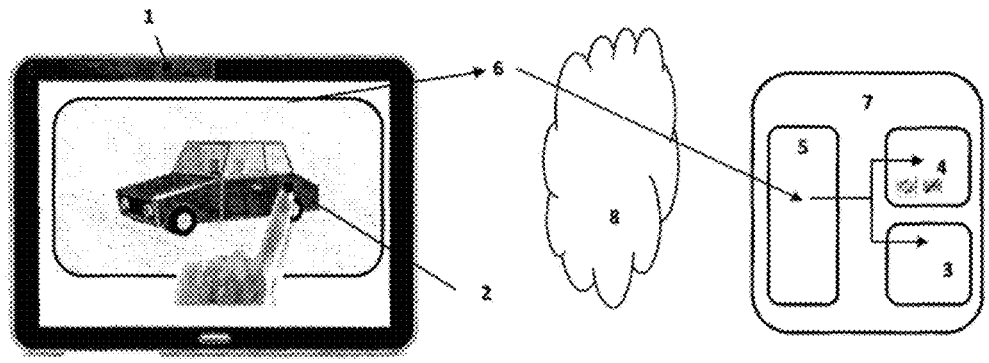
Fig. 2  Activate vehicle object - "Rotate" & "Color" object properties
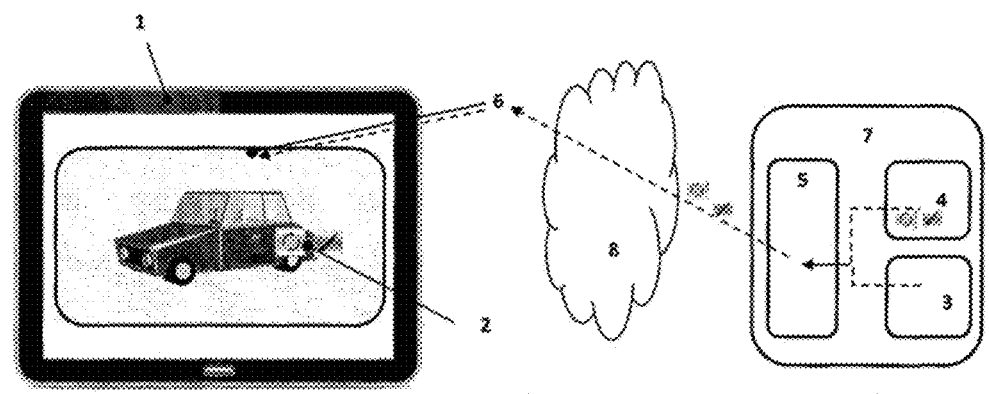
Fig. 3  Valid object properties "Rotate" & "Color" from object control unit 4
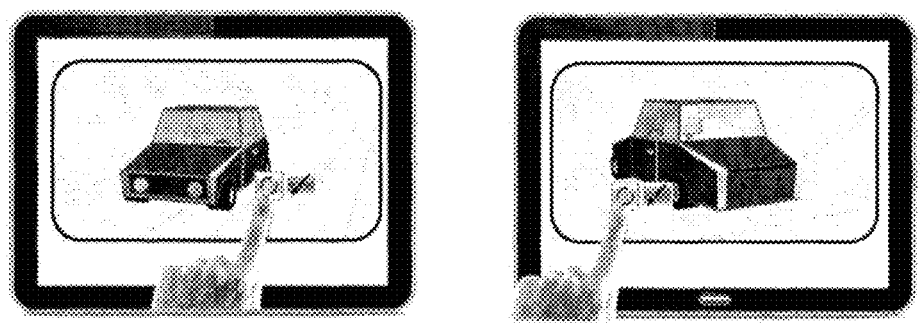
Fig. 4  Activating the object property - object can be rotated interactively

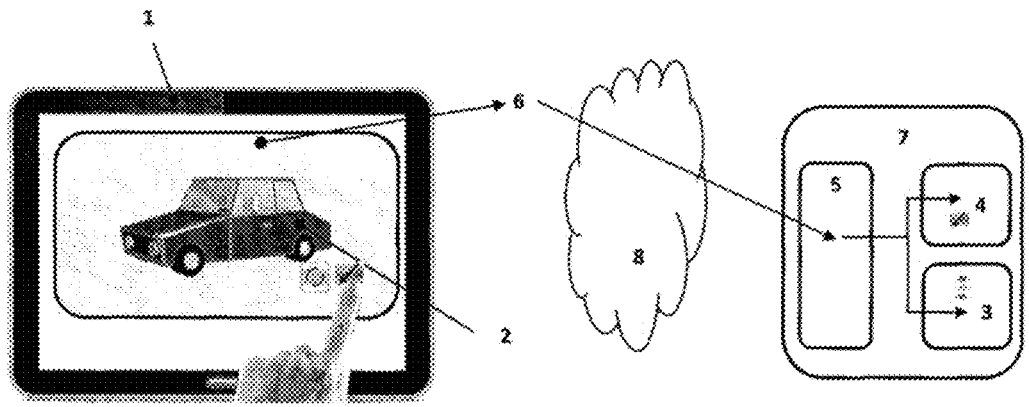
Fig. 5    Activating the "Color" object property
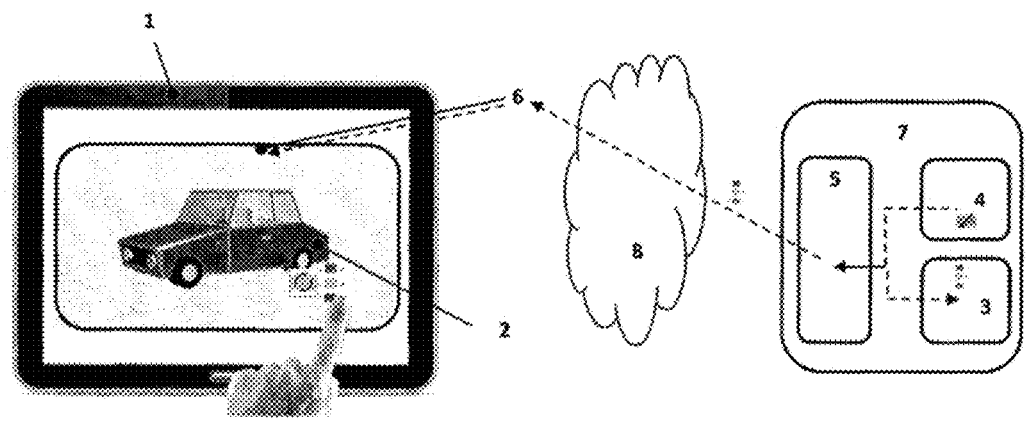
Fig. 5.1    Valid color values from the assigned "Vehicle color" attribute from the variant configuration 3 - "Blue" selected
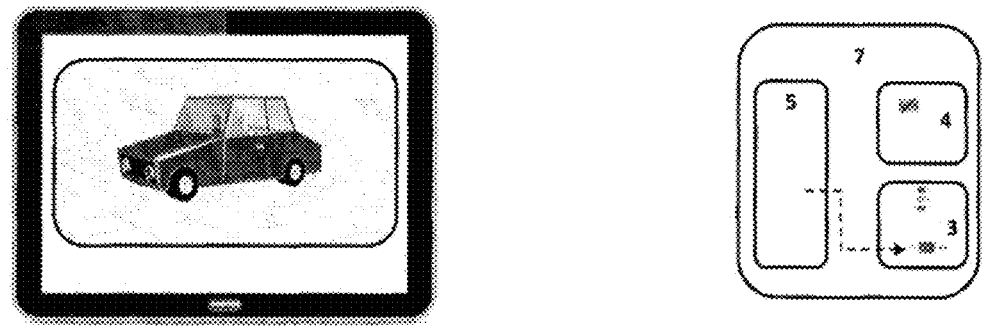
Fig. 5.2    The vehicle in the modified color "Blue" with "feedback" to configuration 3

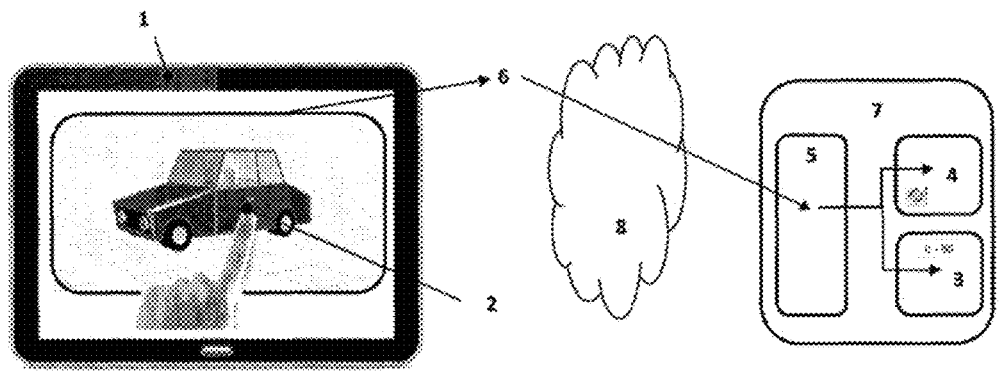
Fig. 6   Activate "Driver door" object ... we want to adjust the driver seat ...
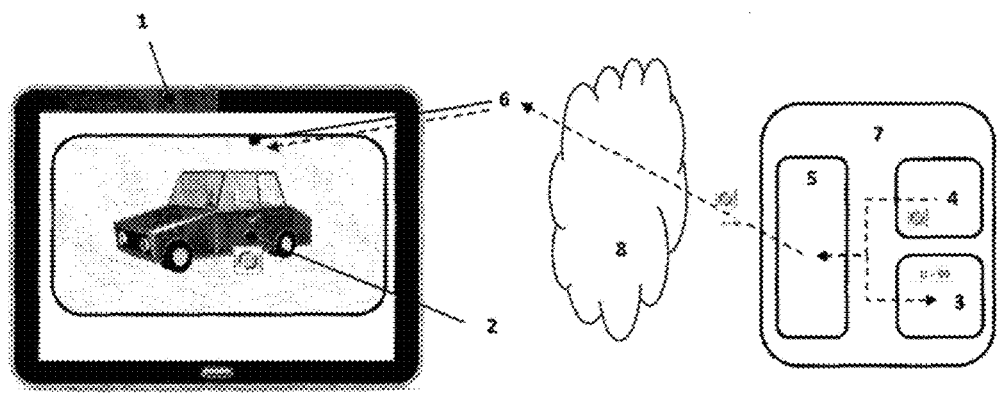
Fig. 6.1   The "Rotate" object property from the object control unit 4 of the "Driver door"
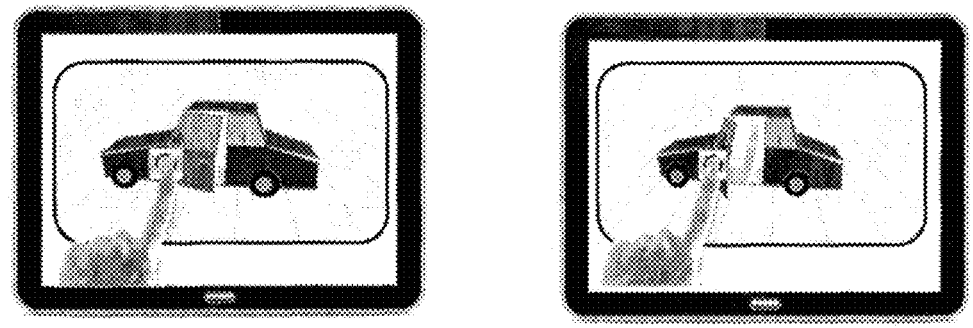
Fig. 6.2   Rotate (open) the door (0 - 90 degrees) with "feedback" to configuration 3

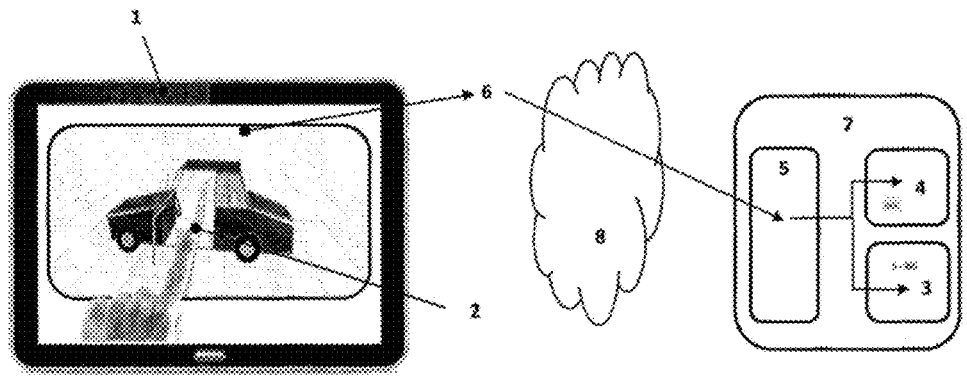
Fig. 7     Activate "Seat" object - "Slide" object property
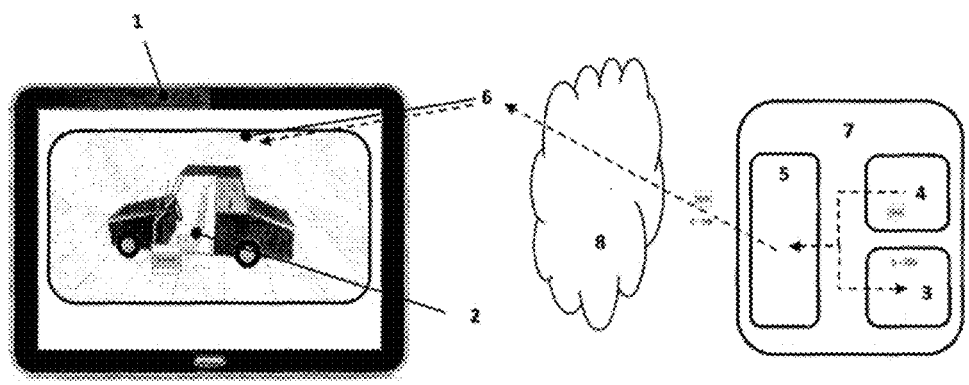
Fig. 7.1     The "Slide" object property from the object control unit 4 of the "Seat" object
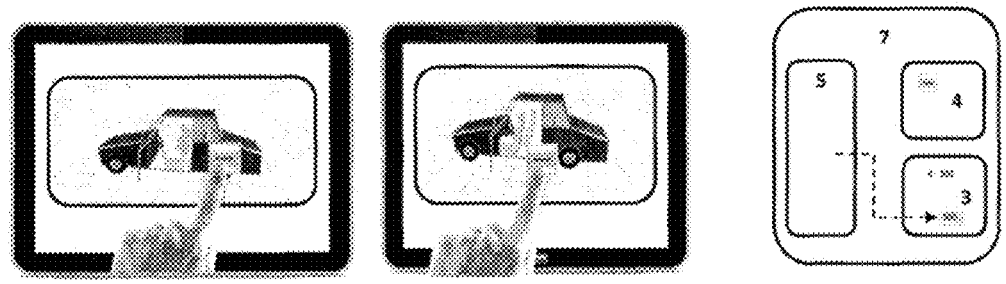
Fig. 7.2     Moving the seat (0 - 300 mm) with "feedback" of the value to the "driver seat adjustment range" attribute from the configuration 3

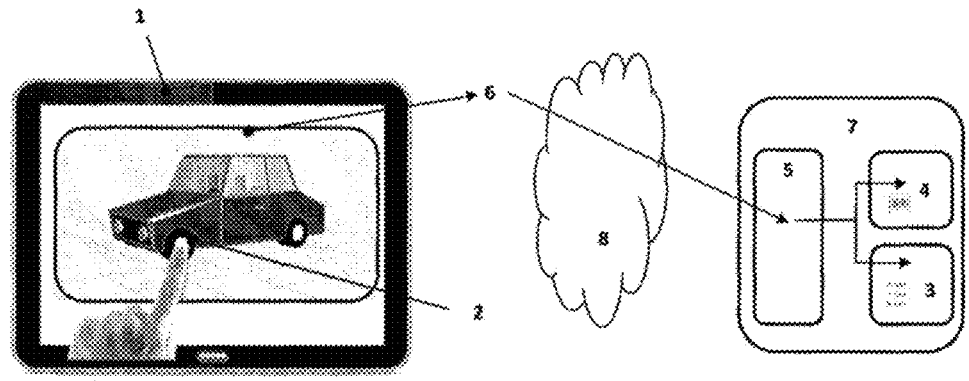
Fig. 8    Activate "Wheels" object – "Select/Add" object property
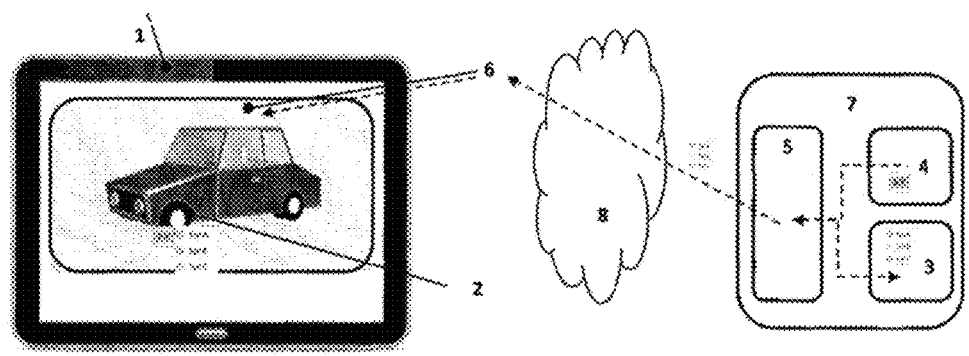
Fig. 8.1    The "Select/Add" object property with the assigned "Wheel types" attribute from the configuration 3
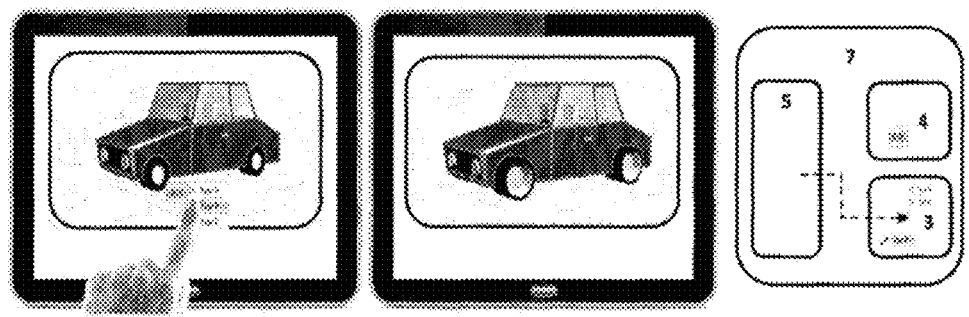
Fig. 8.2    The selected wheels with "feedback" to configuration 3

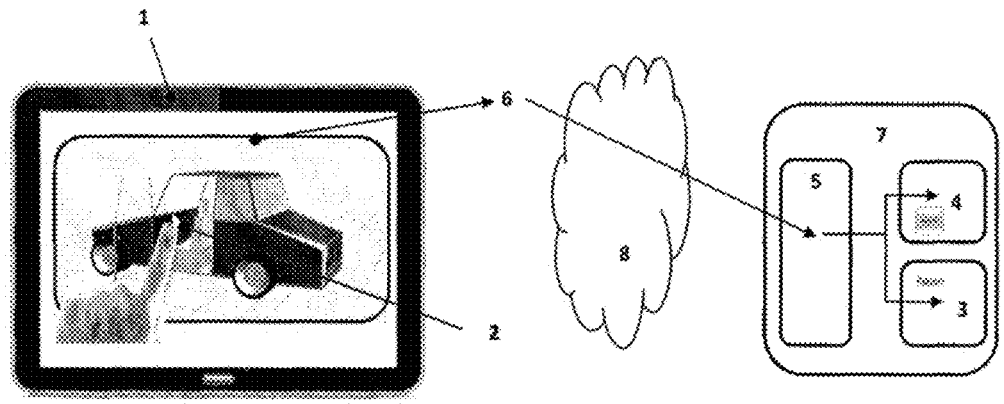
Fig. 9    Activate "Steering wheel" object – "Scale/Zoom" object property
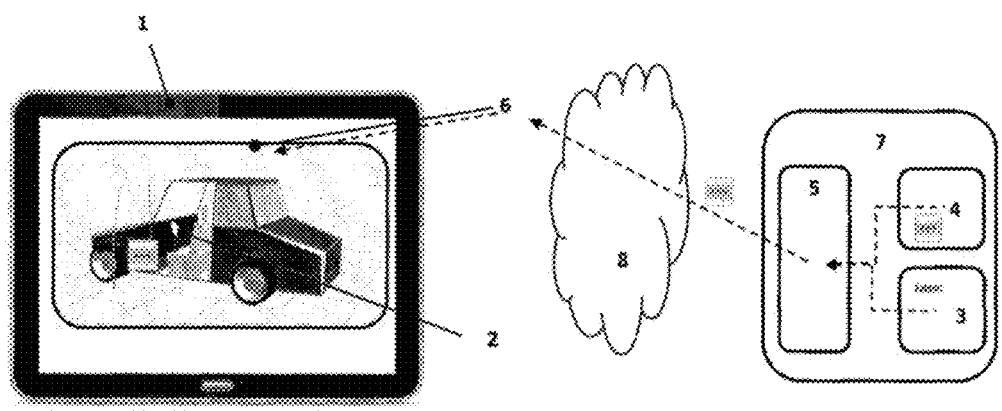
Fig. 9.1   The "Scale/Zoom" object property with the assigned "Steering wheel scaling factor" attribute from the configuration 3
Fig. 9.2   The "scaled" steering wheel with "feedback" of the factor to the configuration 3

METHOD AND SYSTEM FOR GENERATING A VISUAL INTERACTIVE PRODUCT CONFIGURATION

BACKGROUND OF THE INVENTION

Field of the Invention

The invention relates to a method and to a system for generating a visual interactive product configuration, preferably based on interactive digital 3D objects, which are displayed on a preferably mobile operating device that works offline (locally) or is connected online via an Internet connection to a data processing system. The method according to the invention is intended to provide straightforward intuitive operation of a configuration for configuring complex customized products. In addition, a system is provided therefor.

SUMMARY OF THE INVENTION

Society today has evolved into an information society, and will shift even further in this direction. Mobile computing exists everywhere nowadays. It has become almost a matter of course to use mobile operating devices such as e.g. smartphones or tablet computers to send or receive with a simple "finger swipe" information, orders or messages via the Internet. Crucial to this activity are the touch functions, which have now become indispensable, and which display, on request, functions or information on the displays, which are of limited length and width. In all societies around the world, this functionality is changing the strategy of how data information is displayed, acquired and processed "in layers".

Configurators according to the prior art conventionally manipulate complex technical products "click by click using the mouse (operator control)". The flood of information, which is hard to keep track of, is reduced by subdividing into screen masks and menus. The large amount of effort involved in creating graphical objects that change in form after valuation in the operating masks means that they are currently used only occasionally. Moreover, an additional window is also needed for this additional graphical object view.

It is known that manufacturers and/or distributors provide a large number and variety of product configurators offline on USB, CD/DVD/hard disk or online via the Internet for custom product creation.

Operating the configurators for complex technical systems or products proves difficult and confusing, however, because of the technical options and dependencies associated with acquiring a large number of technical parameters. Even employees in the company's own engineering or sales department often find these configurators too complex to operate.

Another reason is the continuous technological development of the computer devices. It is increasingly common to use mobile phones (smartphones) or tablet PCs that have a convenient control system that connects communication via the Internet to the computers or server systems of product manufacturers merely by touching a digital object with the finger. As already explained, this also requires a new way of operating product configurators that is compatible with these devices and with operation by humans.

As a result of the ever-increasing complexity of most technical products, it is practical and advantageous if customers can use product configurators from the manufacturers to specify or define to their requirements independently their custom products such as e.g. machinery, equipment, etc. directly and as simply as possible. This can only be done, however, by resolving the discrepancy between simple and intuitive operation and the necessary acquisition of parameters in order to be able to specify the complex products and their logic without errors.

DE 19 940 209 A1, WO-A-98/52144, EP 1 087 342 A1 and EP 1251 444 B1 disclose methods and arrangements which use input fields, which are arranged in numerous screen menus and additional screen masks, to acquire technical parameters within the configurators. In order to have a better understanding of the numerous menus and input masks, at the end of each input of the technical parameters, a visual product representation is displayed to the user by means of CAD data models from a CAD or product database. Nevertheless, it is very often no longer possible to track from this procedure which parameter changes or inputs have initiated the specific changes to the design or geometry of the product or even product assemblies. The consequence is termination of the product configuration, making it necessary for the sales or service department of the manufacturer to spend additional time and money on advice, or in the worst case, an order or contract is not even placed for the product.

If these configurators that work according to the prior art are applied to the mobile operating devices of today (notebooks, tablets, ultrabooks, smartphones, smartwatches, i.e. devices that facilitate online use via the Internet), major problems arise from the unsuitable (outdated) operating software of the configurators, because too many windows and functions and too much information are shown on the display.

Hence the object of the invention is to present a method and a system for generating a visual product configuration, preferably based on interactive digital 3D objects, which overcomes the disadvantages of the product configurations known from the prior art. The aim of said method and system is to allow users to configure technically sophisticated products easily and in a hands-on manner, i.e. to formulate visually "his" custom, complex product directly in an interactive 3D object which models the product virtually, or in interactive 3D object scenarios. Photo-realistic depictions of 3D objects are also possible.

3D visualization shall be understood to mean here the conversion of technical drawings and two-dimensional data into three-dimensional virtual models or spaces. This involves either modelling the 3D data freely in a 3D program or importing existing CAD data. All the modelling steps (elements) and all the associated dimensions (parameters) are saved in this process individually and attributably, i.e. it is also possible to make subsequent alterations to the models systematically and in a controlled manner by changing the input values.

This object is achieved according to the invention by the features of the independent claims. The dependent claims contain advantageous developments of the invention. To achieve this object, the invention includes a method for generating an active visual product configuration based on interactive digital 2D or 3D objects, which are displayed on a preferably mobile operating device that works offline (locally) or is connected online via an Internet connection to a data processing system, wherein the editing options and degrees of freedom and/or object properties of the object are defined in an object control unit integrated in the data processing system, and a variant model for the product to be configured on the basis of this object is created in the data processing system, wherein the parameters of the variant model are assigned to the corresponding object and to the editing options and degrees of freedom thereof defined in the object control unit. In a visualization unit assigned to the operating device, the complex variant model is then presented visually in a 3D scenario for the active product configuration, wherein said active product configuration is performed by means of a touch screen (display with touch function) integrated in the operating device and/or by means of a pointing device, and all the editing options and degrees of freedom of the object can be animated. During the product configuration, data communication takes place between the visualization unit and the object control unit and also the configuration instance of the variant model via a communication control unit. The method according to the invention for product configuration advantageously allows a reduction in the amount of data on the display. In addition, the user is provided with an easily comprehensible structure corresponding to the graphically depicted product and, by using interactive 3D objects, with a simplified, convenient touch facility for retrieving additional data and/or functions. The method according to the invention allows the user to navigate in the 3D model and thereby configure a technical product. According to another feature of the invention, traditional CAD systems and/or other software programs for 2D and/or 3D object modeling are used to generate the objects. It is advantageously provided that for each configurable product is created a corresponding variant model, which contains all the attributes, sets of rules, properties and parameters that ensure error-free valuation of the parameters of the configurable product. In addition, it is also provided that the editing options and degrees of freedom defined in the object control unit are defined for a specific object, thereby allowing the variant model to be formulated and modified interactively. According to a particular feature of the invention, the communication control unit controls on the basis of the assignments implemented in the object control unit, the data communication between the visualization unit and the valid "reading space of the current configuration instance" of the variant model via an Internet connection between the operating device and data processing system. Alternatively, according to another feature, the communication control unit controls on the basis of the assignments implemented in the object control unit, the data communication between the visualization unit and the valid "reading space of the current configuration instance" of the variant model via the control unit, the communication unit and the configuration instance of the variant model, which in the case of offline operation, however, are implemented locally on the operating device. According to a particular feature, a software component is used to transfer the visualization unit locally to the mobile operating device, whereby the complex variant model is shown visually as a "3D scenario" by the assigned graphical objects and the interactive functionalities thereof.

According to another feature, the present invention also comprises a system for generating an active visual product configuration on the basis of interactive digital 2D or 3D objects (2), which configuration can be operated on a preferably mobile operating device having integral touchscreen (display with touch function) and/or a pointing device, which operating device is connected via an Internet connection to a data processing system, or alternatively can be operated offline (locally) thereon, wherein an object control unit is integrated in the data processing system, and the operating device is assigned a visualization unit. The product configuration takes place during data communication between the visualization unit and the object control unit via a control unit assigned to the data processing system or implemented locally on the operating device, via communication control unit and the configuration instance of the variant model.

The method according to the invention allows the user, in conjunction with his primarily mobile operating device and the associated special operation by touch-sensitive displays, and in particular the additionally limited display size, nonetheless to configure or specify complex and sophisticated products independently. The interactive digital two-dimensional or three-dimensional objects allow the user to grasp the product formulation/situation visually "at a glance" and hence clearly, and thus to configure or specify said product formulation/situation without errors. In addition, by virtue of assigning parameters to interactive graphical objects, there is no need to use traditional operating menus and operating masks for entering parameters. Direct changes to model or shape can be made and observed visually immediately by simply "dragging" on an object detail provided for this purpose. Thus in principle it is possible merely by "dragging" to produce from a sphere a cube-like structure.

The method according to the invention is explained in greater detail below with reference to exemplary embodiments.

The system comprises an operating device 1 having an associated special operation by touch-sensitive displays. Obviously, a standard pointing device can alternatively also be used. The object 2 symbolizes two-dimensional or three-dimensional graphical objects. These objects can be generated in a known manner using conventional CAD systems or using other known software programs for 2D or 3D object modelling. In order that the product configuration, which is controlled by graphical objects, can be performed consistently and without errors, what is known as a variant model 3 is created for a configurable product. The variant model 3 contains the definition of attributes or parameters and the definition of the corresponding sets of rules or dependencies in order to ensure error-free valuation of the parameters of the configurable product. The degrees of freedom and/or object properties of the graphical objects 2 are defined and specified in the object control unit 4. In a further step, the attributes of the variant model 3 are assigned to the corresponding object(s) 2 and to the degrees of freedom and/or object properties thereof. Thus the object control unit 4 makes it possible to generate for any 3D objects (CAD models, meshes, etc.) "movable, geometrically alterable, color-variable, etc." digital objects in a very short period of time with minimum effort and without additional explicit programming for an interactive, graphical product configuration. According to the prior art, all changes or movements would always have to be reprogrammed explicitly involving considerable effort. The communication unit 5 controls the data communication e.g. via the Internet between the visualization unit 6 and the valid "solution space of the current configuration instance" of the variant model 3 on the basis of the assigned object properties and/or degrees of freedom implemented in the object control unit 4. The communication unit 5 is of crucial importance because it controls the communication and data transfer either via Internet connection 8 between the interactive graphical object editing on the mobile operating device and the data processing system 7 of the manufacturer or provider, or, in the case of local offline use, directly between visualization unit 6, control unit 4 and, if applicable, configuration instance of the variant model 3. The communication unit 5 hence provides to the visualization unit 6 the "solution space of the current configuration instance" for the valuation of the object degrees of freedom and also returns the specifically user-generated valuation(s) of the attributes and/or object degrees of freedom belonging to the configuration instance of the variant model 3 for further processing in the running configuration instance on the server of the manufacturer, or, in the case of offline operation, directly to the configuration instance and/or control unit 4, which in this case are running locally. The visualization unit 6, which a software component transfers locally to the mobile operating device, displays the complex variant product visually as a "3D scenario" by means of the assigned graphical objects and the interactive functionalities thereof.

The method provided by the present invention also allows an advantageous expansion of the object degrees of freedom and/or object properties. For instance, if an additional degree of freedom "Hop" is meant to be needed, then this "function" only needs to be programmed once in the visualization unit 6, and from this moment on, the "Hop" degree of freedom can be assigned to each object via the control unit 4.

In addition, if required, the operator can be "guided step-by-step" through the interactive 3D object in order to follow a necessary logical sequence.

Placing configured products into e.g. a basket, pricing, transfer to ERP or CRM systems, etc. can be performed on the basis of procedures known from the prior art. This also applies to derived component lists, spare parts, etc.

The method according to the invention is explained below with reference to exemplary embodiments.

There is shown:

BRIEF DESCRIPTION OF THE SEVERAL VIEWS OF THE DRAWING

FIG. 1 is a schematic diagram of all the components;
FIG. 1.1 shows the assignment of the attributes of the variant model 3 to the objects 2;
FIG. 1.2 shows the assignment/maintenance of object properties of the objects 2;
FIGS. 2 to 9.2 show diagrams and examples that explain the procedure.

DESCRIPTION OF THE INVENTION

In the example shown, the method for visual product configuration using interactive 3D objects is explained with reference to a car model on an operating device 1 in the form of a tablet computer comprising a touchscreen. The choice of a car model shall be understood to be merely by way of example. The method can be used to configure all possible products for which the properties can be altered and which have a multiplicity of possible properties, attributes, components or design options.

After the visualization unit 6 starts running, the user immediately sees an optionally real, photo-realistic three-dimensional object 2 in the form of a car model (only shown schematically).

If the user activates by a mouse (pointing device) or by touching with the finger as shown in FIG. 2 regions or modules of the vehicle (object 2), then the object properties and/or degrees of freedom stored or assigned in the object control unit 4 are immediately displayed. This object control unit facilitates interactive design for any 3D models/objects, without any additional explicit programming, by changing the degrees of freedom for e.g. the length, width, angle of rotation etc. By means of the object control unit 4 in combination with the visualization unit 6, digital graphical objects (CAD models, meshes, etc.) can be moved or modified in terms of shape or composition with minimal effort and no programming effort in a very short period of time. According to the prior art, all modifications or movements would always have to be reprogrammed explicitly involving a large amount of effort for the creation process and the subsequent test phases.

In FIG. 2, the bodywork of the car is activated, and the two object properties "Rotate" and "Select color", which have been assigned to the variant model 3 (car) in the control unit 4, are immediately shown/displayed in FIG. 3 for editing.

If the user now activates by "touching and simultaneously dragging" the "Rotate" button or the vehicle bodywork directly as shown in FIG. 4, then the variant model 3 (vehicle) can be rotated according to the speed at which the user swipes across the display.

FIG. 5 shows the object property "Change color" by way of example. In the example, the intention is to select a different vehicle color and finally to display the vehicle in the new color. The user does this by tapping on the button containing the "paintbrush icon" displayed in the visualization unit 6. The communication unit 5, which continuously synchronizes the data from the control unit 4 and, if applicable, the current configuration instance of the variant model 3, immediately offers for selection the currently valid colors as shown in FIG. 5.1. If the user has selected "Blue" as the required color in the example, the vehicle of FIG. 5.2 is automatically depicted in the color blue. In addition, the color valuation is transferred via the communication unit 5 to the configuration instance of the variant model 3. The communication unit 5 controls the data communication via the Internet between the visualization unit 6 and the valid "reading space of the current configuration instance" of the variant model 3 on the basis of the assignments implemented in the object control unit 4. The communication unit 5 is of crucial importance because it controls the communication and data transfer via Internet connection 8 between the interactive graphical object editing on the mobile operating device and the data processing system 7 of the manufacturer or provider. The communication unit 5 hence provides to the mobile operating device 1 the "solution space of the current configuration instance" for the valuation of the object degrees of freedom and also returns the specifically user-generated contents of the parameters and/or object degrees of freedom for the configuration instance of the variant model 3 for the purpose of further processing in the running configuration instance on the server of the manufacturer.

FIG. 6 and FIG. 6.1 depict the "Driver door" object being activated and opened. In a similar manner to the procedure already described above, the communication unit 5 provides to the visualization unit 6 the "Rotate door" object degree of freedom within the limits of 0-90 degrees from the configuration instance of the variant model 3 and from the control unit 4. The visualization unit 6, which a software component transfers locally to the mobile operating device, displays the complex variant product visually as a "3D scenario" by means of the assigned graphical objects and the interactive functionalities thereof.

If the user now activates by "touching and simultaneously dragging" the "Rotate" button or the driver door directly as shown in FIG. 6.2, the user opens the vehicle, and the interior containing additional vehicle objects 2 becomes visible. The communication unit 5 can advantageously also return the opening angle, like the color selection, to the configuration instance 3.

As shown by the additional diagrams in FIG. 7 to FIG. 9.2, it is possible to implement the most varied requirements for movements, changes in shape such as scaling and stretching, adding modules as shown in FIGS. 8, 8.1 and 8.2, for hiding modules or making modules transparent, for animations etc. of objects and sub-objects or modules. The diagrams are not intended to have any limiting effect.

Thus the present invention provides a method and a system that make it possible, by means of straightforward definition and maintenance of the degrees of freedom/editing options of a 2D or 3D object and the assignment of parameters from the variant model 3, for people without programming knowledge to generate in a very short period of time (a few minutes) movable, geometrically alterable, color-variable etc. digital objects for an interactive, graphical product configuration.

The invention claimed is:

1. A method for generating an immediate visual product configuration from stored object properties based on interactive digital three-dimensional (3D) objects, the method comprising:
providing an operating device configured to display the interactive digital 3D objects, the operating device having a touch screen or a pointing device assigned thereto;
providing stored object properties of a respective object in an object control unit integrated in a data processing system, and creating in the data processing system a variant model for a product to be configured on the basis of multiple user-selected layers of the stored object properties of the respective object;
visually representing, in a visualization unit assigned to the operating device, the variant model in a 3D scenario for the immediate visual product configuration, and enabling the immediate visual product configuration by way of at least one of the touch screen integrated in the operating device or the pointing device, wherein the stored object properties can be animated on the operating device;
during visually representing the immediate visual product configuration, effecting data communication between the visualization unit, the object control unit and a configuration instance of the variant model via a communication control unit;
using a software component to transfer the visualization unit locally to the operating device, whereby the variant model is shown visually as the 3D scenario by assigned graphical objects and interactive functionalities of the operating device; and
making changes to the variant model by dragging on a detail of an interactive digital 3D object displayed by the operating device to display at least one of the stored object properties.

2. The method according to claim 1, wherein the operating device is a mobile operating device that works offline or that is connected online via an Internet connection to the data processing system.

3. The method according to claim 1, which comprises generating the respective object by way of a conventional computer-aided design (CAD) system.

4. The method according to claim 1, which comprises generating the respective object by way of a software program for 3D object modeling.

5. The method according to claim 1, which comprises creating a corresponding variant model for each configurable product, the corresponding variant model containing all attributes, sets of rules, properties and parameters that ensure error-free valuation of the configurable product.

6. The method according to claim 1, wherein the communication control unit controls on a basis of assignments implemented in the object control unit, the data communication between the visualization unit and a valid reading space of the configuration instance of the variant model via an Internet connection between the operating device and data processing system.

7. The method according to claim 1, wherein the communication control unit controls on a basis of assignments implemented in the object control unit, the data communication between the visualization unit and a valid reading space of the configuration instance of the variant model via a further control unit, the communication unit and the configuration instance of the variant model, which in a case of offline operation are implemented locally on the operating device.

* * * * *